United States Patent
Tokuda et al.

(10) Patent No.: US 7,301,155 B2
(45) Date of Patent: Nov. 27, 2007

(54) RADIATION DETECTOR AND RADIATION IMAGING APPARATUS AND METHOD FOR PRODUCING RADIATION DETECTOR

(75) Inventors: Satoshi Tokuda, Shiga-ken (JP); Hiroyuki Kishihara, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 334 days.

(21) Appl. No.: 10/691,637

(22) Filed: Oct. 24, 2003

(65) Prior Publication Data

US 2004/0094721 A1 May 20, 2004

(30) Foreign Application Priority Data

Nov. 20, 2002 (JP) ............... 2002-336540

(51) Int. Cl.
*G01T 1/24* (2006.01)
(52) U.S. Cl. .................................. 250/370.13
(58) Field of Classification Search ............ 250/370.13
See application file for complete search history.

(56) References Cited

U.S. PATENT DOCUMENTS

| | | | | |
|---|---|---|---|---|
| 4,243,885 A | * | 1/1981 | Agouridis et al. ..... | 250/370.07 |
| 5,396,072 A | * | 3/1995 | Schiebel et al. ....... | 250/370.09 |
| 5,693,947 A | * | 12/1997 | Morton ................... | 250/370.09 |
| 6,251,701 B1 | * | 6/2001 | McCandless ............ | 438/95 |
| 6,398,624 B1 | * | 6/2002 | Izumi et al. ............ | 451/38 |
| 6,420,710 B1 | * | 7/2002 | Verger et al. .......... | 250/370.06 |
| 6,512,233 B1 | * | 1/2003 | Sato et al. ............. | 250/370.13 |
| 2002/0002992 A1 | * | 1/2002 | Kariya et al. ........... | 136/255 |

FOREIGN PATENT DOCUMENTS

JP 2001242255 A * 9/2001
WO WO 0068999 A1 * 11/2000

OTHER PUBLICATIONS

Aramoto et al., 16.0 % Efficient Thin-Film CdS/CdTe Solar Cells, Jpn. J. Appl. Phys. vol. 36, pp. 6304-6305 (1997).

* cited by examiner

*Primary Examiner*—David Porta
*Assistant Examiner*—David S Baker
(74) *Attorney, Agent, or Firm*—Rader, Fishman & Grauer PLLC

(57) ABSTRACT

A radiation detector provided in a substrate with a detection layer which is sensitive to radiation, the detector being characterized in that said detection layer is formed by a polycrystal film comprising either one of CdTe (cadmium telluride), ZnTe (zinc telluride) and CdZnTe (cadmium zinc telluride) or a laminate film of polycrystal including at least one thereof, and is doped with Cl.

13 Claims, 5 Drawing Sheets

Present invention

RADIATION DETECTOR AND RADIATION IMAGING APPARATUS AND METHOD FOR PRODUCING RADIATION DETECTOR

BACKGROUND OF THE INVENTION

1. Field of the Invention

The present invention relates to a radiation detector and a radiation imaging apparatus having a function of detecting radiation including X-ray, ã-ray, light and the like and used in the medical, industrial, and nuclear fields. More specifically, the present invention relates to the art wherein a radiation-sensitive detection layer is formed of a semiconductor which is formed by polycrystals.

2. Description of the Related Art

As conventionally known radiation detectors, those using a monocrystal material of CdTe (cadmium telluride), CdZnTe (cadmium zinc telluride) for a radiation-sensitive detection layer can be recited. Since these radiation detectors have wide gap and comprise heavy atoms, they are operable at room temperature and have high sensitivity. However, it is extremely difficult to make monocrystals grow over a large area for surface imaging, and an attempt has been made to form a surface detector by patching monocrystal members of small area together in tile-like manner. However, for obtaining a large area of several centimeters square which is required for industrial or medical imaging apparatus, the material cost of monocrystal members is extraordinarily high and treatment of the joints is complicated.

On the other hand, polycrystal films of CdTe (cadmium telluride) and CdZnTe (cadmium zinc telluride) formed by CVD method, PVD method and the like include many crystal grain boundaries, and experiments carried out by the present inventors have revealed that the polycrystal films are inferior in electrical and radiation detecting characteristics to monocrystals if used as deposition. That is, in the case of using as a radiation detector of X-ray area, the detection layer needs a thickness of several hundreds of micrometers for absorbing X rays. When a bias is applied to a detection layer of polycrystal having such a large thickness so as to collect signal charges by X-ray irradiation, the generated charges are trapped by grain boundaries of polycrystal and the like, causing significant decrease in sensitivity and responsibility.

By the way, it is also known that, as is the case of a solar battery having a conversion layer of polycrystal thin film (several tens of micrometers) of CdTe (cadmium telluride), by applying a $CdCl_2$ (cadmium chloride) solution of about 0.3 M on the surface of the polycrystal thin film and executing heat treatment for about 25 minutes under the atmosphere of about 420° C., it is possible to improve the light converting efficiency (JJAP, Vol. 36 (1997) Part 1, No, pp6304-6305). This would attribute to the fact that $CdCl_2$ (cadmium chloride) infiltrate into the film and protects the grain boundaries of the polycrystal thin film.

However, the examples of conventional arts have the following problems.

That is, even if the conventional approach is applied to the radiation detector in which the detection layer has a thickness of as large as about 100 times of thickness of solar battery, $CdCl_2$ (cadmium chloride) does not sufficiently infiltrate into the film, so that satisfactory effect cannot be obtained. In addition, if such an approach is applied to a substrate having a large area, it is impossible to achieve sufficient in-plane uniformity by coating.

SUMMARY OF THE INVENTION

The present invention was devised in consideration of the above circumstances, and it is an object of the present invention to provide a radiation detector and a radiation imaging apparatus having excellent sensitivity and response, as well as excellent in-plane sensitivity by making Cl generally uniformly disperse in the detection layer surface.

In order to achieve the above object, the present invention is configured as follows.

Said detection layer is formed by a polycrystal film comprising either one of CdTe (cadmium telluride), ZnTe (zinc telluride) and CdZnTe (cadmium zinc telluride) or a laminate film of polycrystal including at least one thereof, and said detection layer is doped with Cl.

Since the grain boundaries and the like existing in the detection layer formed of polycrystals is protected by Cl, and Cl is doped, the protection is also effective not only in the vicinity of surface but also in the interior. Therefore, it is possible to make the detecting characteristics of radiation (sensitivity, responsibility and the like) satisfactory while keeping the leak current low.

Also in the present invention, it is preferred that said detection layer is formed by vapor deposition or sublimation while using as a source, a mixture of a first material including at least one of CdTe (cadmium telluride), ZnTe (zinc telluride) and CdZnTe (cadmium zinc telluride) and a second material including at least one of $CdCl_2$ (cadmium chloride) or $ZnCl_2$ (zinc chloride).

Since the source comprising the mixture of the first material and the second material includes Cl, Cl is simultaneously included into the detection layer when the detection layer is formed by vapor deposition or sublimation. Therefore, it is possible to distribute Cl generally uniformly not only in the vicinity of the surface of the detection layer, but also in the direction of depth. Furthermore, by conducting Cl doping in vapor phase, the crystal grains in the detection layer are uniformized (improvement in morphology), with the result that the output uniformity in the surface is improved.

Also it is preferred in the present invention that said detection layer is formed by sublimation in the condition that said substrate and said source are closely opposed to each other.

By forming the detection layer in vapor phase, it is possible to uniformly dope Cl with higher throughput compared to the case where coating is used, so that is possible to form a detection layer having excellent detecting characteristic.

A radiation detector provided in a substrate with a detection layer which is sensitive to radiation, the said detector comprising the following elements.

Preferably, after forming said detection layer by a polycrystal film comprising either one of CdTe (cadmium telluride), ZnTe (zinc telluride) and CdZnTe (cadmium zinc telluride) or a laminate film of polycrystal including at least one thereof, Cl is doped by heating while supplying said detection layer with vapor containing Cl atoms. Also, a gas containing Cl may be supplied in place of vapor.

After forming the detection layer comprising polycrystal, Cl is supplied by the vapor (or gas) containing Cl, and Cl infiltrates into the interior of the detection layer by heat treatment. Therefore, defect of grain boundary or the like existing in the detection layer is protected by Cl, and since Cl is doped, the protection is effective on not only in the vicinity of the surface but also in the interior. Accordingly, it is possible to improve the detecting characteristics of radiation (sensitivity, responsibility and the like) while keeping the leak current low. Furthermore, by conducting Cl doping in vapor phase such as vapor or gas, the crystal grains in the detection layer are uniformized (improvement of morphology), with the result that the output uniformity in the surface is improved.

Furthermore, in the present invention, it is preferred that atmosphere of said heat treatment contains at least one of $N_2$, $O_2$, $H_2$ and noble gases (He, Ne, Ar) kept at 1 atmospheric pressure, and contains at least one of $N_2$, $O_2$, $H_2$ and noble gases (He, Ne, Ar) kept at $1.3 \times 10^{-4}$ to 0.5 atmospheric pressure.

Since the Cl vapor pressure increases due to the reduced pressure, it is possible to conduct the treatment at lower temperature and to further reduce the leak current. At the same temperature, a larger amount of Cl can be supplied, so that it is possible to reduce the time required for treatment.

Preferably, the radiation imaging apparatus of the present invention is equipped with said radiation detector, a plurality of charge accumulation capacitors which accumulate charges from said conversion layer, and a switching matrix substrate including switching devices arranged in array for reading out charges of said plurality of charge accumulation capacitors, and driving and reading circuits.

Since imaging is achieved by using the radiation detector having excellent detecting characteristics of radiation, it is possible to acquire a radiation image of high quality which is useful in the medical or industrial field.

Also the present specification discloses means for solving the problems as follows:

(1) A method for producing a radiation detector which is provided in the substrate with a detection layer which is sensitive to radiation, the method comprising the steps of forming said detection layer by a polycrystal film comprising either one of CdTe (cadmium telluride), ZnTe (zinc telluride) and CdZnTe (cadmium zinc telluride) or a laminate film of polycrystal including at least one thereof, and doping said detection layer with Cl.

According to the invention described in the above (1), since grain boundary or the like existing in the detection layer formed of polycrystal material is protected by Cl, and Cl is doped, the protection is effective not only in the vicinity of the surface but also in the interior. Accordingly, it is possible to improve the detecting characteristics of radiation (sensitivity, responsibility and the like) while keeping the leak current low.

(2) The method for producing a radiation detector according to (1), characterized in that said detection layer is formed by vapor deposition or sublimation while using as a source, a mixture of a first material including at least one of CdTe (cadmium telluride), ZnTe (zinc telluride) and CdZnTe (cadmium zinc telluride) and a second material including at least one of $CdCl_2$ (cadmium chloride) or $ZnCl_2$ (zinc chloride).

According to the invention described in the above (2), since the source comprising the mixture of the first material and the second material includes Cl, Cl is simultaneously included into the detection layer when the detection layer is formed by vapor deposition or sublimation. Therefore, it is possible to produce a radiation detector in which Cl is distributed generally uniformly not only in the vicinity of the surface of the detection layer, but also in the direction of depth. Furthermore, by conducting Cl doping in vapor phase, the crystal grains in the detection layer are uniformized (improvement in morphology), with the result that it is possible to produce a radiation detector having improved uniformity in the surface.

(3) A method for producing a radiation detector provided with a detection layer which is sensitive to radiation in a substrate, comprising the steps of: forming said detection layer by a polycrystal film comprising either one of CdTe (cadmium telluride), ZnTe (zinc telluride) and CdZnTe (cadmium zinc telluride) or a laminate film of polycrystal including at least one thereof, and doping Cl by heating while supplying said detection layer with vapor (or gas) containing Cl atoms.

According to the invention described in the above (3), by forming the detection layer in vapor phase, it is possible to obtain a radiation detector in which Cl is more uniformly doped than the case where coating is employed.

(4) A method for producing a radiation detector whereby said detection layer is additionally-doped with Cl by conducting the step of doping said detection layer with Cl as described in the method for producing a radiation detector as described in the above (1) or (2) and further conducting the method for producing a radiation detector as described in the above (4) or (5).

According to the invention described in the above (4), after doping Cl at the time of formation of detection layer, Cl is additionally doped after formation of the detection layer, protection of crystal grain boundary is more desirably achieved. Therefore, it is possible to improve the detector characteristics while further reducing the leak current.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

Figure 1:
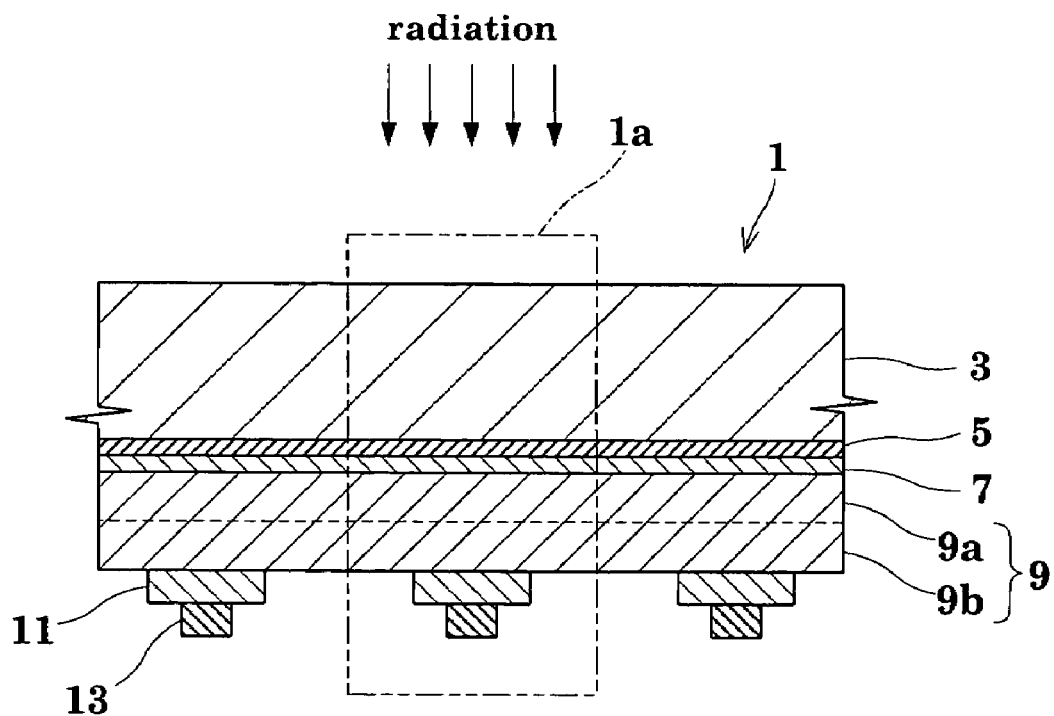
FIG. 1 is a longitudinal section view showing configuration of a radiation detector according to an example.
Figure 2:
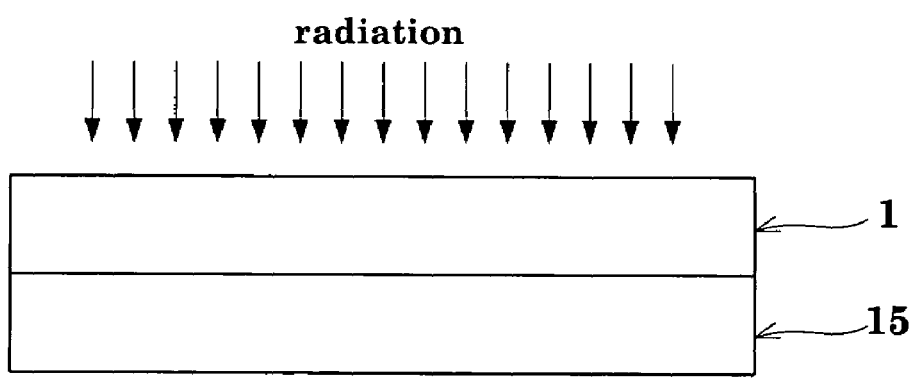
FIG. 2 is a side section view showing schematic configuration of a radiation imaging apparatus.
Figure 3:
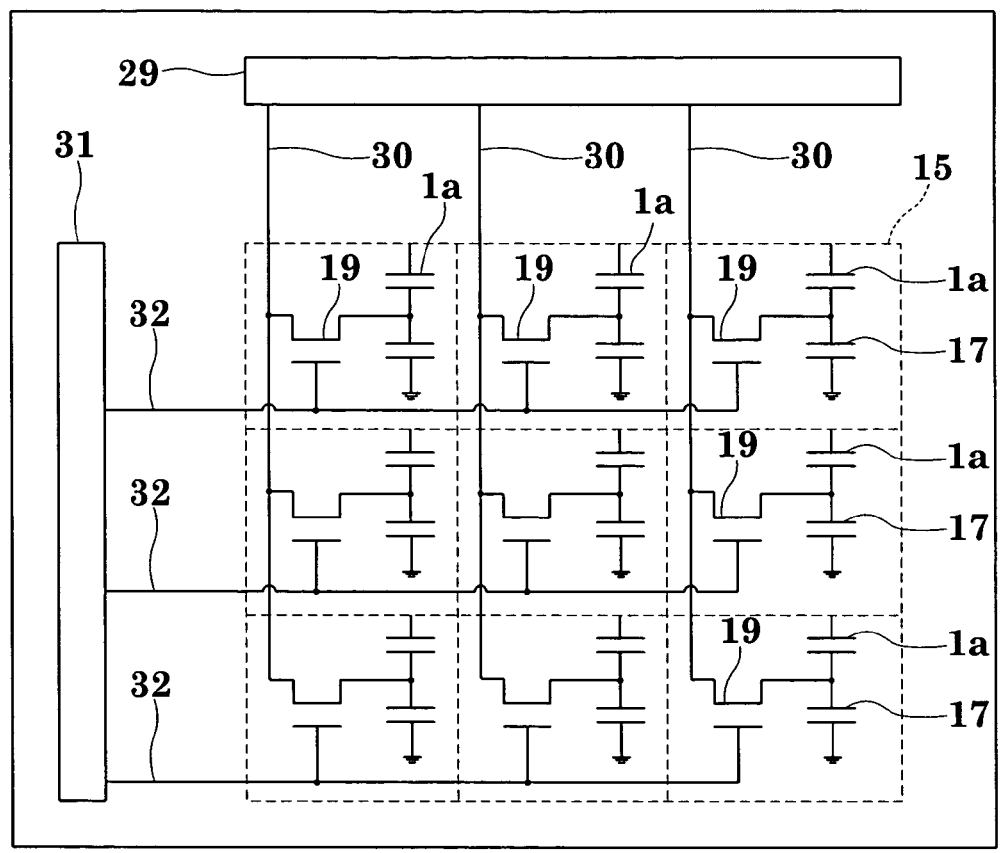
FIG. 3 is a circuitry diagram showing configuration of a switching matrix substrate and peripheral circuits.
Figure 4:
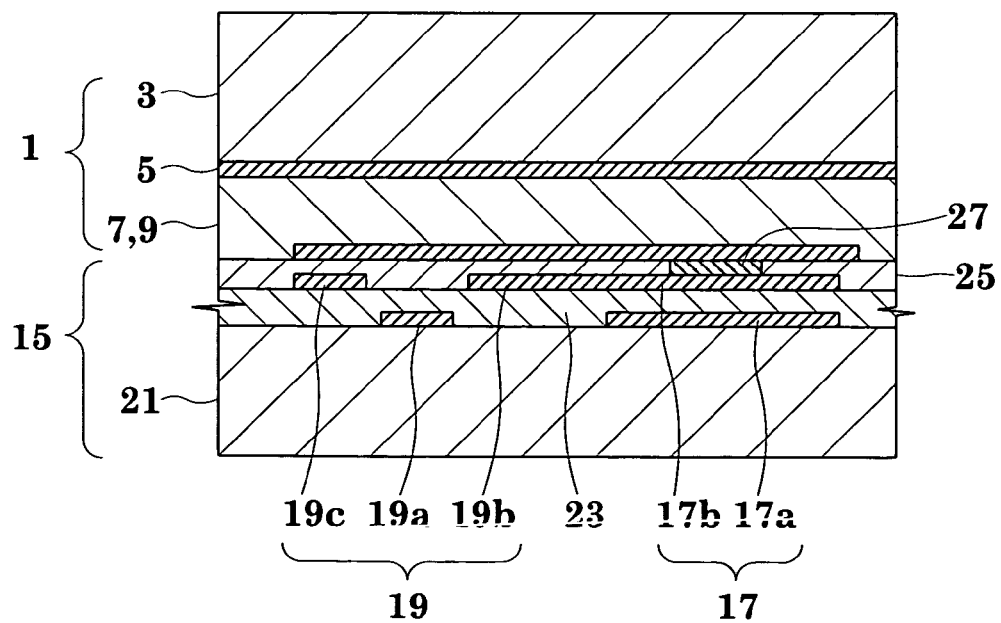
FIG. 4 is a schematic view showing a longitudinal section of a radiation imaging apparatus.

FIGS. 1 to 4 relate to one example of the present invention, and FIG. 1 is a longitudinal section view showing configuration of a radiation detector according to an example, FIG. 2 is a side section view showing schematic configuration of a radiation imaging apparatus, FIG. 3 is a circuitry diagram showing configuration of a switching matrix substrate and peripheral circuits and FIG. 4 is a schematic view showing a longitudinal section of a radiation imaging apparatus.

A radiation detector 1 includes a supporting substrate 3 having permeability to radiation, a common electrode 5 for bias charge application formed on the bottom surface of the supporting substrate 3, a hole injection preventing layer 7 on the bottom side of the common electrode 5, a detection layer 9 which generates electron-hole pair carriers in response to incident radiation, an electron injection preventing layer 11 formed on the bottom surface of the detection layer 9, and a detection electrode 13 for collecting carriers, all of which are laminated.

Figure 5:
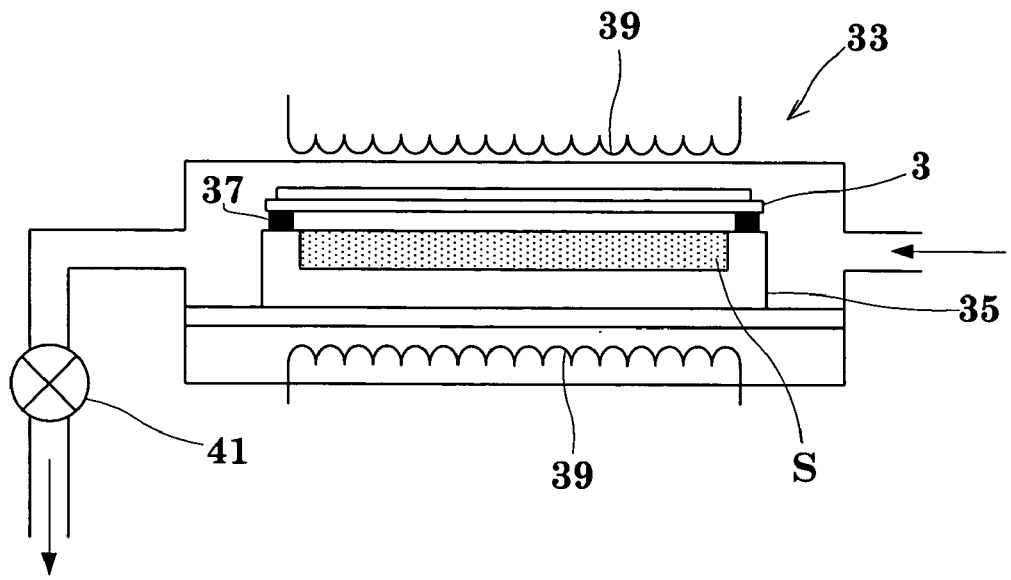
FIG. 5 is a schematic view showing a condition of one step for forming a detection layer in a radiation detector.

As the above supporting substrate 3, those having small absorption coefficient of radiation are preferred, and for example, glass, ceramic ($Al_2O_3$, AlN), silicon and the like materials can be adopted. In this example, it is so designed that radiation enters from the supporting substrate 3 side as shown in FIG. 5, and it is operated in the condition that a positive bias voltage is applied on the common electrode 5.

The detection layer 9 is preferably produced in the following manner, and is formed by a polycrystal film comprising either one of CdTe (cadmium telluride), ZnTe (zinc telluride) and CdZnTe (cadmium zinc telluride) or laminate films 9a, 9b of polycrystal including at least one thereof and doped with Cl.

The common electrode 5 and the detection electrode 13 are formed of, for example, conductive materials such as ITO, Au, Pt and the like. As the hole injection preventing layer 7, CdS, ZnS films and the like which form an n-type layer are exemplified, and as the electron injection preventing layer 11, $Sb_2Te_3$, $Sb_2S_3$, ZnTe films which form a p-type layer are exemplified.

As shown in FIG. 2, the radiation detector 1 configured as described above is formed integrally with a switching matrix substrate 15 to function as a radiation imaging apparatus. With such a configuration, carriers generated at the detection layer 9 of the radiation detector 1 are collected device by device by the switching matrix substrate 15, and accumulated device by device to be read out in the form of an electric signal.

As shown in FIG. 3, on the switching matrix substrate 15 are formed a capacitor 17 which is a charge accumulation capacitor and a thin-film transistor 19 serving as a switching device in correspondence with the detection device 1a in FIG. 1. Although FIG. 3 shows the 3×3 (pixel) matrix configuration for convenience of explanation, practically, more pixels such as 1024×1024 and the like are provided.

Detailed configuration of the switching matrix substrate 15 is as shown in FIG. 4. That is, on the top surface of an insulation substrate 21 are formed an earth-side electrode 17a of the capacitor 17, a connection-side electrode 17b of the capacitor 17 via an insulation film 23 on a gate electrode 19a of the thin-film transistor 19, and a source electrode 19b and a drain electrode 19c of the thin-film transistor 19, which are laminated. The top surface of this laminate is covered with a protective insulation film 25.

The connection-side electrode 17b and the source electrode 19b are simultaneously formed and communicated with each other. As the insulation film 23 and the insulation film 25, a plasma SiN film, for example, can be adopted. In the condition that the radiation detector 1 and the switching matrix substrate 15 are positioned, these are bonded together by heating and pressuring while aligning the detection electrode 13 and the connection-side electrode 17b of the capacitor 17 and interposing, for example, an anisotropic conductive film (ACF) or anisotropic conductive paste therebetween. Consequently, the radiation detector 1 and the switching matrix substrate 15 are bonded and integrated. At this time, the detection electrode 13 and the connection-side electrode 17b are made conductive by an interposed conductive portion 27.

The switching matrix substrate 15 further comprises a read driving circuit 29 and a gate driving circuit 31. The read driving circuit 29 is connected to vertical read wiring 30 connecting drain electrodes 19c of the thin-film transistor 19 of the same column. The gate driving circuit 31 is connected to transverse read wiring 32 connecting the gate electrodes 19a of the thin-film transistor 19 of the same raw. Although omitted in the drawing, in the read driving circuit 29, a preamplifier is connected to each read wiring 30.

Unlike the above, a configuration such that the read driving circuit 29 and the gate driving circuit 31 are integrated in the switching matrix substrate 15 is also employed.

Explanation will now be made on the details of the method for producing the above radiation detector 1.

The common electrode 5 of the radiation detector 1 is formed by lamination in accordance with the sputtering, vapor deposition and the like methods. In the same manner, the hole injection preventing layer 7 is formed on the bottom surface of the common electrode 5. Then on the bottom surface of the hole injection preventing layer 7, the detection layer 9 is formed using, for example, close sublimation method as will be explained later.

To be more specific, the supporting substrate 3 is placed in an deposition chamber 33. Since the deposition chamber 33 is equipped therein with a lower susceptor 35 for placement of a source S, the supporting substrate 3 is placed in the condition that the deposition surface is directed downward via a spacer 37. On the top and bottom of the deposition chamber 33, heaters 39 are provided. After making the interior of the deposition chamber 33 under reduced pressure by operating a vacuum pump 41, the source S is heated by the top and bottom heaters 39. As a result of this, the source S sublimates and adheres to the bottom surface of the supporting substrate 3, whereby the detection layer 9 is formed. The detection layer 9 is formed as a thick film of about 300 m.

As the source S to be placed in the lower susceptor 35, a mixture of a first material including at least one of CdTe (cadmium telluride), ZnTe (zinc telluride) and CdZnTe (cadmium zinc telluride) and a second material including at least one of $CdCl_2$ (cadmium chloride) or $ZnCl_2$ (zinc chloride) can be exemplified.

For example, after placing and treating CdTe containing $CdCl_2$ as the source S, the source S is replaced with ZnTe containing $CdCl_2$ and the same treatment is conducted. As a consequence of this, a CdTe film containing Cl is formed as the first layer 9a of the detection layer 9 and a ZnTe film containing Cl is formed as the second layer 9b. The detection layer 9 may be formed by a single layer.

Next, after laminating and forming a semiconductor layer for the electron injection preventing layer 11 by sputtering, deposition or the like, the electron injection preventing layer 11 is formed by patterning. Then, in the same manner, after laminating and forming a metal film for the detection electrode 13, the detection electrode 13 is formed by patterning. Through this process, the radiation detector 1 is formed.

Then the switching matrix substrate 15 and the radiation detector 1 are integrated as described above to complete the radiation imaging apparatus.

According to the radiation detector 1 configured as described above, since the grain boundary or the like existing in the detection layer 9 formed of polycrystal material is protected by Cl, and Cl is doped, the protection is effective not only in the vicinity of the surface but also in the interior. Accordingly, it is possible to improve the detecting characteristics of radiation (sensitivity, responsibility and the like) while keeping the leak current low. Furthermore, by conducting Cl doping in vapor phase, the crystal grains in the detection layer 9 are uniform (improvement in morphology). As a result, the output uniformity in the surface can be improved.

As for the radiation imaging apparatus, since the imaging can be executed by using the radiation detector 1 having excellent detecting characteristic of radiation, it is possible to acquire a radiation image of high quality which is useful in the medical or industrial field.

The detection layer 9 may be formed in the following manner: after forming a polycrystal film comprising either one of CdTe (cadmium telluride), ZnTe (zinc telluride) and CdZnTe (cadmium zinc telluride) or a laminate film of polycrystal including at least one thereof, Cl is doped by heating while supplying said detection layer 9 with vapor containing Cl atoms. More specifically, Cl is doped in the detection layer 9 by conducting heat treatment in the condition that powder containing at least one of $CdCl_2$ (cadmium telluride) or $ZnCl_2$ (zinc chloride) or a sintered body thereof is opposed.

The atmosphere of heat treatment of this case preferably contains at least one of $N_2$, $O_2$, $H_2$ and noble gases (He, Ne, Ar) kept at 1 atmospheric pressure. Furthermore, The atmosphere of heat treatment of this case preferably contains at least one of $N_2$, $O_2$, $H_2$ and noble gases (He, Ne, Ar) kept at $1.3 \times 10^{-4}$ to 0.5 atmospheric pressure.

By adopting such atmosphere, treatment at low temperature is enabled, so that it is possible to further reduce the leak current. At the same temperature, a larger amount of Cl can be supplied, so that the time required for treatment can be reduced.

Figure 6:
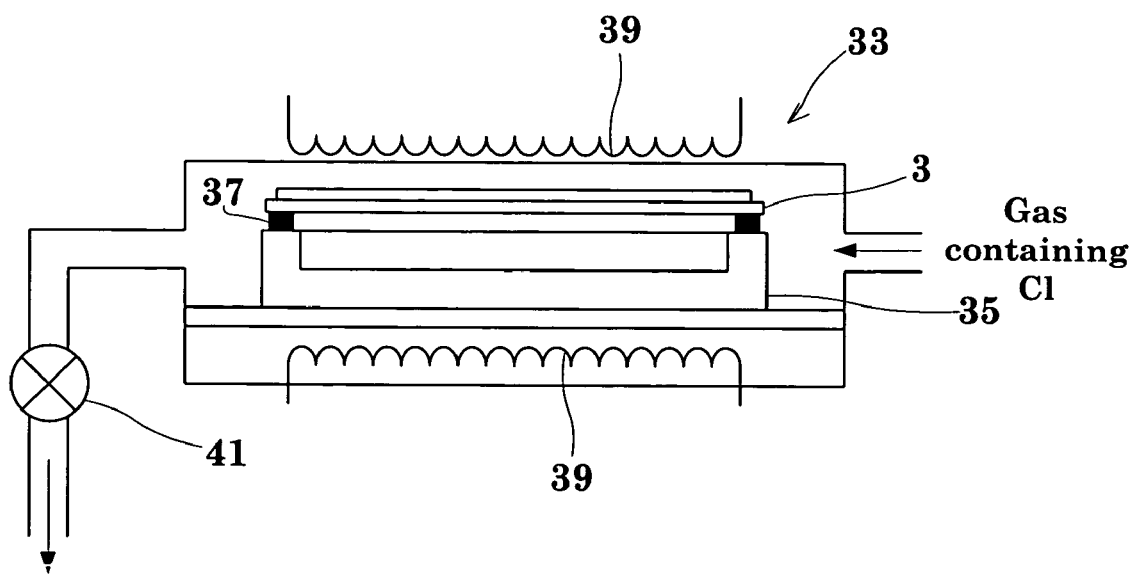
FIG. 6 is a schematic view showing a condition of another step for forming a detection layer in a radiation detector.

As shown in FIG. 6, it is also possible that after forming a polycrystal film comprising either one of CdTe (cadmium telluride), ZnTe (zinc telluride) and CdZnTe (cadmium zinc telluride) or a laminate film of polycrystal including at least one thereof, Cl is doped by heating while supplying said detection layer 9 with vapor containing Cl atoms without placing the source in the lower susceptor 35.

Preferably, after doping the detection layer 9 with Cl, the detection layer 9 is subjected to additional doping with Cl.

Since Cl is doped again following formation of the detection layer 9 after doping Cl at the time of forming the detection layer 9, protection of grain boundary is more desirably achieved. Therefore, it is possible to further improve the characteristic of the radiation detector 1 while further reducing the leak current.

<Comparison between prior art and present invention>

Figure 7:
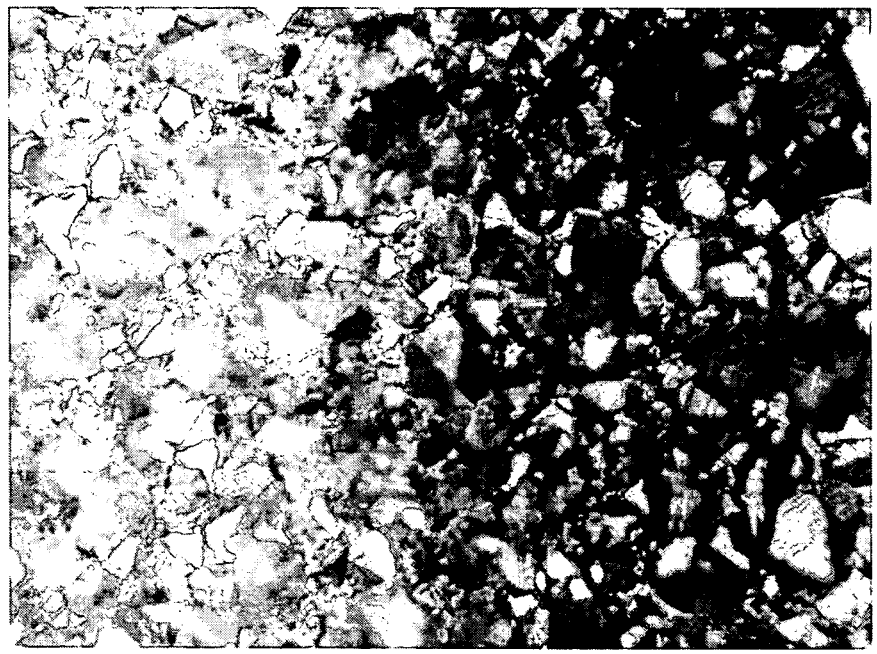
FIG. 7 is a photograph for comparison showing a surface condition of a detection layer in a conventional example.
Figure 8:
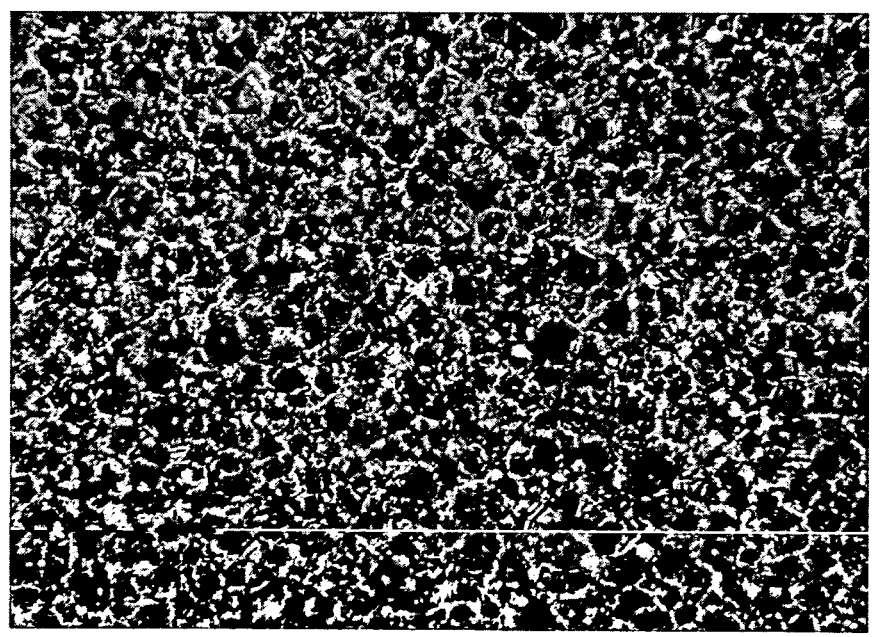
FIG. 8 is a photograph for comparison showing a surface condition of a detection layer in the prevent invention.
Figure 9:
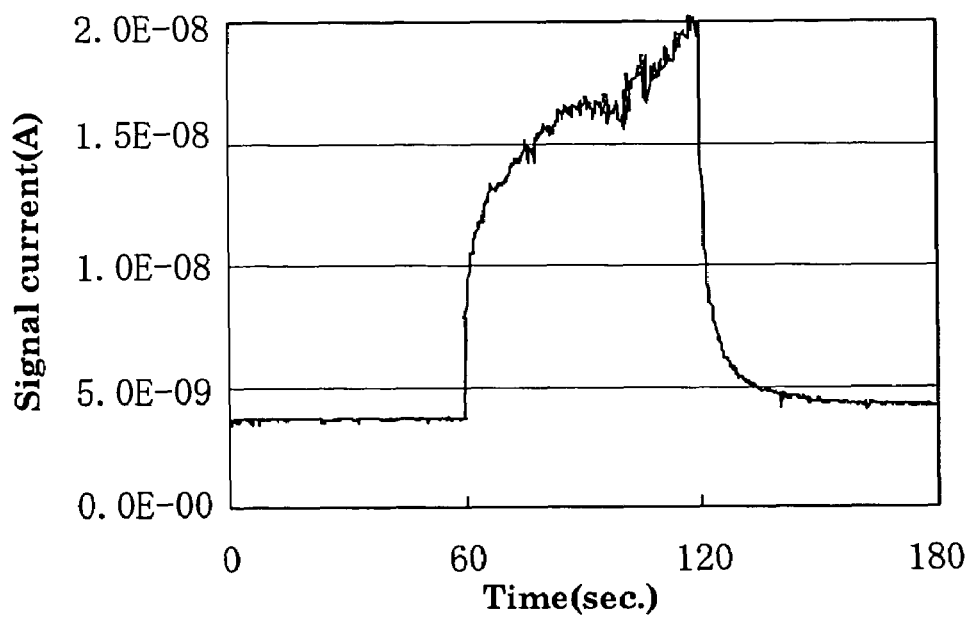
FIG. 9 is a graph showing response characteristics by a radiation detector according to the conventional example.

FIG. 7 is a photograph for comparison showing a surface condition of a detection layer in a conventional example; and FIG. 8 is a photograph for comparison showing a surface condition of a detection layer in the prevent invention. FIG. 9 is a graph showing response characteristics by a radiation detector according to the conventional example; and FIG. 10 is a graph showing response characteristics by a radiation detector according to the present invention.

From FIG. 7 and FIG. 8, significant difference in crystal grains is clearly observed between the prior art and the present invention. According to the present invention, by conducting Cl doping in vapor phase such as vapor or gas, the crystal grains in the detection layer 9 are uniform (improvement in morphology), and hence the output uniformity in the surface is improved.

Figure 10:
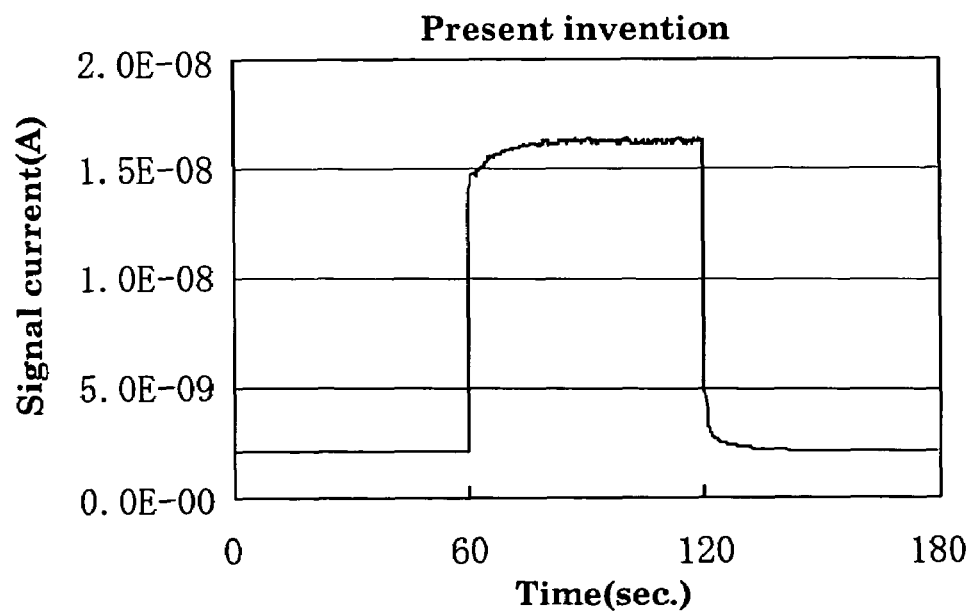
FIG. 10 is a graph showing response characteristics by a radiation detector according to the present invention.

Also it is apparent from the graphs shown in FIG. 9 and FIG. 10, the response is improved in the present invention compared to the prior art. These figures graphically show the output signals when radiation of rectangular pulse is entered into the radiation detector 1, and the acuter leading edge and the acuter trailing edge than those of the prior art are observed.

It is to be noted that the present invention is not limited to the preferred embodiments as described above, and various modified embodiments are included as follows.

(1) The radiation detector 1 shown in the above-described embodiment is not necessarily equipped with the hole injection preventing layer 7 and the electron injection preventing layer 11, and at least one of these may be omitted depending on the characteristic. Further, the hole injection preventing layer 7 and the electron injection preventing layer 11 may be interchanged by means of the bias polarity to be applied.

(2) The present invention is not limited to the two-dimensional radiation detector of the planar rectangular shape as the above-described embodiment, but one-dimensional radiation detector is also possible.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for producing a radiation detector provided in a substrate with a detection layer which is sensitive to radiation, comprising the steps of:

forming said detection layer by a polycrystal film comprising either one of CdTe (cadmium telluride), ZnTe (zinc telluride) and CdZnTe (cadmium zinc telluride) or a laminate film of polycrystal including at least one thereof, and doping said detection layer with Cl, wherein said detection layer is formed by vapor deposition or sublimation while using as a source, a mixture of a first material including at least one of CdTe (cadmium telluride), ZnTe (zinc telluride) and CdZnTe (cadmium zinc telluride) and a second material including at least one of $CdCl_2$ (cadmium chloride) or $ZnCl_2$ (zinc chloride).

2. A radiation imaging apparatus comprising:

the radiation detector formed by the method according to claim 1;

a plurality of charge accumulation capacitors for accumulating charges from said detection layer; and a switching matrix substrate including switching devices arranged in array, wherein the switching devices read out charges of said plurality of charge accumulation capacitors.

3. A method for producing a radiation detector comprising:

placing a supporting substrate and a source into a deposition chamber, said source being a mixture of a first material and a second material, said first material including at least one of CdTe (cadmium telluride), ZnTe (zinc telluride) and CdZnTe (cadmium zinc telluride, said second material including at least one of $CdCl_2$ (cadmium chloride) or $ZnCl_2$ (zinc chloride);

reducing pressure within said deposition chamber;

heating said source, said source sublimating and adhering to said supporting substrate to form a detection layer.

4. The method according to claim 3, further comprising:
replacing said source with another source, said another source being a mixture of a third material and a fourth material, said third material including at least one of CdTe (cadmium telluride), ZnTe (zinc telluride) and CdZnTe (cadmium zinc telluride, said fourth material including at least one of $CdCl_2$ (cadmium chloride) or $ZnCl_2$ (zinc chloride);
heating said another source to form a second layer, said second layer forming on said detection layer.

5. The method according to claim 3, further comprising:
forming a common electrode between said supporting substrate and a hole injection preventing layer,
wherein said detection layer is between said hole injection preventing layer and said common electrode.

6. The method according to claim 5, wherein said hole injection preventing layer is from the group consisting of a CdS film and a ZnS film.

7. The method according to claim 5, wherein an electron injection preventing layer is between said detection layer and a detection electrode.

8. The method according to claim 7, wherein said electron injection preventing layer is from the group consisting of an $Sb_2Te_3$ film, an $Sb_2S_3$ film, and a ZnTe film.

9. The method according to claim 3, further comprising:
forming a common electrode between said supporting substrate and an electron injection preventing layer,
wherein said detection layer is between said electron injection preventing layer and said common electrode.

10. The method according to claim 9, wherein said electron injection preventing layer is from the group consisting of an $Sb_2Te_3$ film, an $Sb_2S_3$ film, and a ZnTe film.

11. The method according to claim 9, wherein a hole injection preventing layer is between said detection layer and a detection electrode.

12. The method according to claim 11, wherein said hole injection preventing layer is from the group consisting of a CdS film and a ZnS film.

13. A radiation imaging apparatus comprising:
the radiation detector formed by the method according to claim 3;
a plurality of charge accumulation capacitors for accumulating charges from said detection layer; and
a switching matrix substrate including switching devices arranged in array, wherein the switching devices read out charges of said plurality of charge accumulation capacitors.

* * * * *